(12) United States Patent
Canal et al.

(10) Patent No.: US 6,335,707 B1
(45) Date of Patent: Jan. 1, 2002

(54) ELECTRONIC CIRCUIT STRUCTURE WITH OPTIMIZED SPACE REQUIREMENT ACCORDING TO AVAILABLE VOLUME

(75) Inventors: Yves Canal, Antony; Corinne Liguoro, Elbeuf; Emile Pouderous, Boulogne, all of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/646,116

(22) PCT Filed: Mar. 23, 1999

(86) PCT No.: PCT/FR99/00681

§ 371 Date: Sep. 27, 2000

§ 102(e) Date: Sep. 27, 2000

(87) PCT Pub. No.: WO99/51072

PCT Pub. Date: Oct. 7, 1999

(30) Foreign Application Priority Data

Mar. 27, 1998 (FR) .............................. 98 03828

(51) Int. Cl.⁷ .............................................. H01Q 13/00
(52) U.S. Cl. ...................... 343/786; 343/767; 343/774
(58) Field of Search ................................. 343/786, 770, 343/772, 767, 774, 872

(56) References Cited

U.S. PATENT DOCUMENTS

| 4,591,865 A | | 5/1986 | Canal |
| 4,743,918 A | | 5/1988 | Rannou et al. |
| 4,888,597 A | * | 12/1989 | Rebiez et al. ............... 343/778 |
| 5,191,346 A | | 3/1993 | Avignon et al. |
| 5,266,956 A | | 11/1993 | Canal et al. |
| 5,332,998 A | | 7/1994 | Avignon et al. |
| 5,349,358 A | | 9/1994 | Canal |
| 5,446,470 A | | 8/1995 | Avignon et al. |
| 5,534,870 A | | 7/1996 | Avignon et al. |
| 5,563,589 A | | 10/1996 | Blaimont et al. |
| 5,657,033 A | * | 8/1997 | Young ....................... 343/786 |

* cited by examiner

*Primary Examiner*—Don Wong
*Assistant Examiner*—Hoang Nguyen
(74) *Attorney, Agent, or Firm*—Oblon, Spivak, McClelland, Maier & Neustadt, P.C.

(57) ABSTRACT

To make optimum use of an available volume exhibiting in particular surfaces of small radius of curvature, with a view to housing electronic circuits therein, a stack (11) of layers of possibly different compositions (circuits, components, insulants, etc.) is made, these layers being parallel to the surface of largest dimension of this volume.

8 Claims, 2 Drawing Sheets

ELECTRONIC CIRCUIT STRUCTURE WITH OPTIMIZED SPACE REQUIREMENT ACCORDING TO AVAILABLE VOLUME

BACKGROUND OF THE INVENTION

The present invention relates to a structure of electronic circuits having optimized bulk as a function of the volume available.

FIELD OF THE INVENTION

When aircraft, in particular combat aircraft, are required to carry bulky electronic equipment, and when the room available is limited, and especially when this equipment requires a clear "view" for example towards the front of the aircraft, this equipment is placed in the nose of the carrier, in the base of the fin, in the wings or in "pods" (special containers) fixed under the craft. The shape of these locations where the equipment can be housed is often very jagged and/or their dimensions are small, thereby preventing utilization of the entire volume available, owing to the fact that this equipment is generally enclosed in packages of simple geometrical shapes, which cannot be matched to the said jagged shapes.

SUMMARY OF THE INVENTION

The subject of the present invention is a structure of electronic circuits whose external shape can easily be matched in an optimal manner to virtually any shape of housing intended to receive this equipment, this being achieved without disturbing the operation of the equipment, whose components may be as diverse as possible, whilst having optimal performance.

The structure in accordance with the invention comprises at least one stack of layers comprising at least one of the following elements: electrical circuits, electronic circuits, optical circuits, waveguides, discrete components, integrated components, protector elements, thermal elements, insulation elements, stiffening elements; these layers being substantially parallel to the largest surfaces of the volume available, in particular substantially plane surfaces, or at the very least the most plane surfaces of the volume available. Advantageously, at least one of the lateral surfaces of the structure optimally hugs the least plane shape of the volume available. Thus, by virtue of the invention, the said elements can occupy a volume of arbitrary shapes, including shapes having small radius of curvature.

BRIEF DESCRIPTION OF THE DRAWINGS

The present invention will be better understood on reading the detailed description of several embodiments, taken by way of non-limiting examples and illustrated by the appended drawing in which.

DESCRIPTION OF THE PREFERRED EMBODIMENT

The invention is described hereinbelow with reference to a structure of antennas and of associated circuits for equipment such as electronic warfare equipment, airborne radar equipment and telecommunications hardware, but it is of course not limited to these applications alone, and can be implemented so as to produce structures incorporating various mechanical and/or electrical and/or electronic and/or optical and/or thermal elements, in particular to allow these elements to be housed in volumes which hitherto were deemed to be too small and/or to have shapes which were too "tortuous" to allow the optimal housing therein of elements which were traditionally placed in packages, generally of parallelepipedal shape, leaving too much unoccupied volume.

Figure 1:
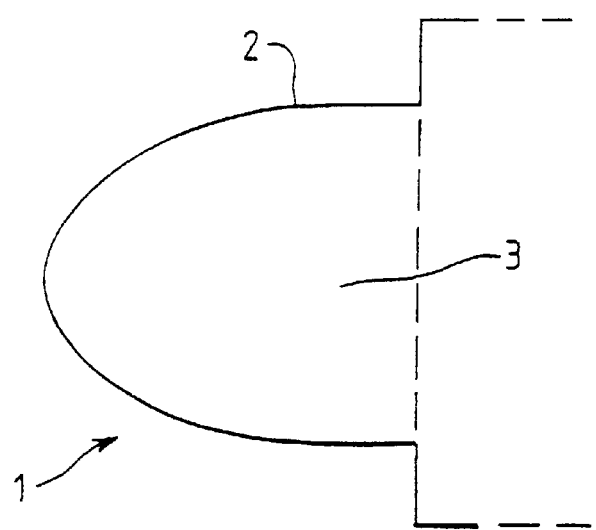
FIG. 1 is a simplified sectional view of a volume having a profile with small radius of curvature, in which the known structures make it possible to house only antennas, without their circuits (phase shifters, power supply etc.), leaving a non-negligible volume unoccupied.

The volume portion 1 represented in FIG. 1 is for example the anterior part of the leading edge of the wing 2 of a fighter aircraft. Generally, nothing is housed in this anterior part. This portion has, in section, an approximately "U"-shaped form, the curved part of which is directed towards the front of the aircraft. This curved part has a small radius of curvature and is therefore housed with great difficulty. Its internal volume 3 is unoccupied, being as it is too small to make it possible to house therein the packages of the circuits located upstream of the antenna (phase shifters, power supply, etc.). These packages have a parallelepipedal general shape, even the smallest dimension of which is greater than the distance D separating the branches of the "U".

Figure 2:
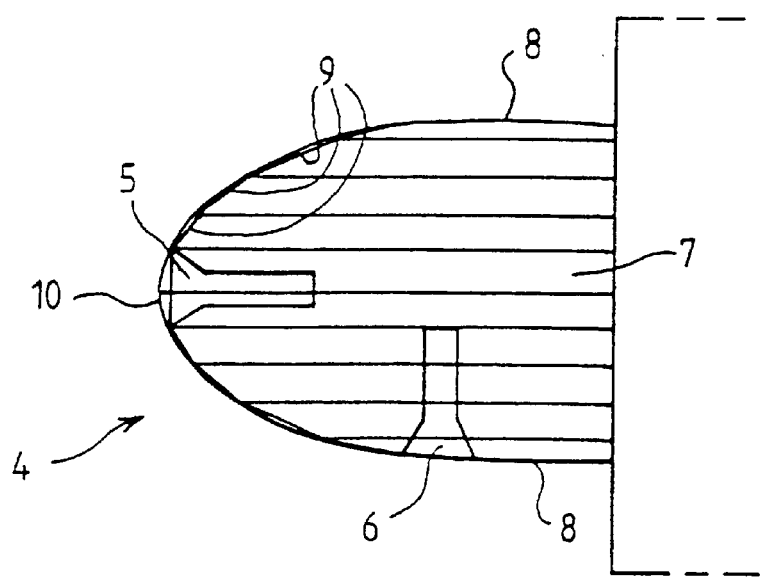
FIG. 2 is a simplified sectional view of a volume in which the invention makes it possible to place antennas, with their circuits, it being possible to orient these antennas in very different directions.

Diagrammatically represented in FIG. 2 is a volume portion 4, similar to the portion 1 of FIG. 1, in which the invention makes it possible to house not only antennas 5 directed towards the front of the carrier aircraft, but also antennas 6 directed towards the ground, as well as circuits, referenced 7 as a whole, incorporated in an integrated manner with the antennas, in stratified form, as explained hereinbelow. According to the invention, the planes of the strata are parallel to the largest surfaces of the volume available, in particular to the plane surfaces, such as the surfaces 8 of the volume portion 4. As a result, the frontal parts 9 of the strata hug the frontal shape 10 of the volume portion 4 as faithfully as possible, the latter having one (or several) small radius (radii) of curvature.

Figure 3:
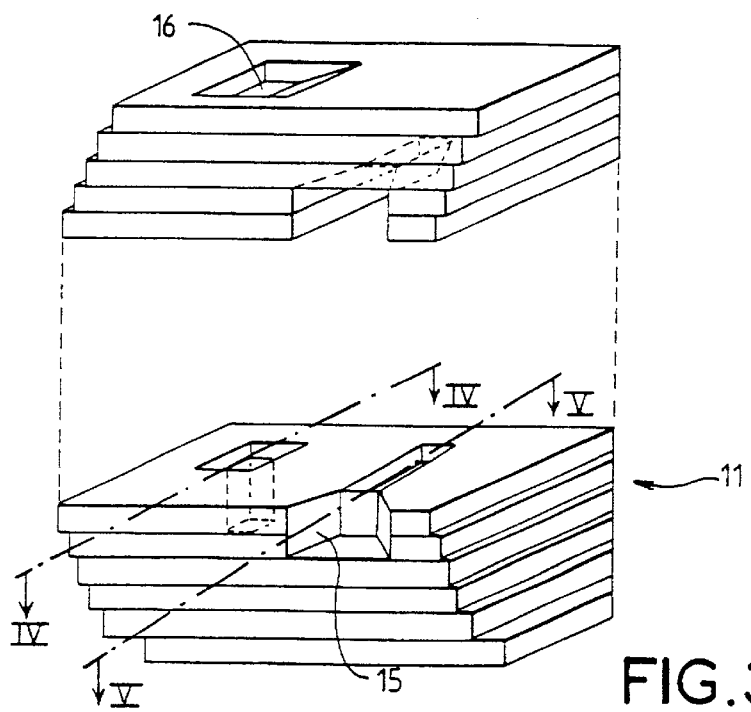
FIGS. 3 to 5 are respectively a simplified exploded perspective view and sectional views along IV—IV and V—V of FIG. 3, these figures referring to an exemplary embodiment of a structure in accordance with the invention.
Figure 4:
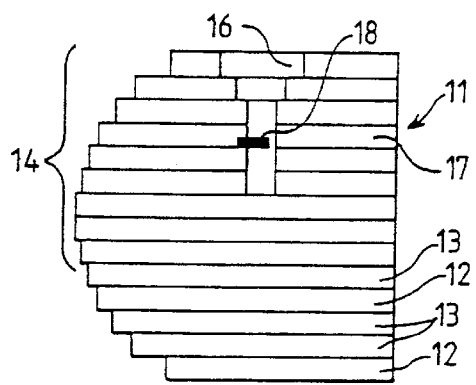
Figure 5:
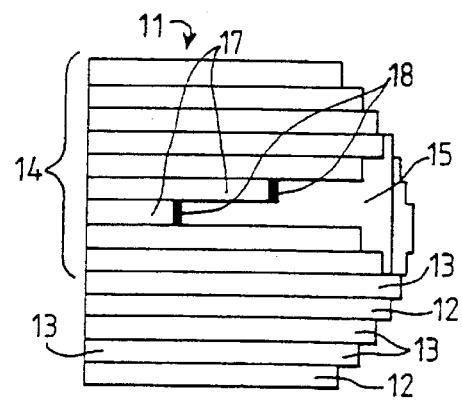

Represented in more detail in FIGS. 3 to 5 is a simplified exemplary stratified structure 11, similar to the structure 7. This structure 11 comprises a stack of layers whose contents, thickness and nature may be very diverse.

Certain layers of the structure 11, such as the layers 12 may be layers made of an insulating material or of a material which absorbs shocks and vibrations. These layers 12 are, for example, the outer layers of the structure, as well as intermediate layers which provide mutual insulation between the layers 13 comprising uninsulated conducting elements. Elements may be included or formed within several successive layers 14. These elements are, for example, integrated antennas. To this end, the layers 14 comprise cutouts directly forming the horns 15, 16 of the antennas (or any other type of antenna), integrated into the structure 11. The horns such as the horn 15 have their axis directed parallel to the planes of the strata, whereas the axis of the horns such as the horn 16 is perpendicular to these planes of the strata. Of course, the axes of other horns could be oblique with respect to the planes of the strata.

Other layers comprise simple and/or complex electronic circuits. Thus, for example, the layers 17 comprise the plungers 18 for exciting the antenna horns 15 and 16 and the links between these plungers and the circuits which are just upstream (in general phase shifters, when dealing with electronic-scanning antennas). Of course, the antennas in question may be array antennas composed of a large number of horns (or of any other type of antenna: dipoles, patches, etc.) and waveguides may be formed in layers of the structure, as close as possible to the antennas.

The other layers of the structure 11 can comprise complex electronic circuits: arrays of phase shifters, transmission/reception circuits, power supply, etc. or else they may be stiffening layers or layers in which electromechanical or optical elements are integrated. Of course, if electrical connections need to be provided between circuits of different layers, these connections are made in a manner similar to that used to connect together circuits belonging to different faces or layers of a simple or multi-layer conventional structure of printed circuits.

The various layers of the structure of the invention may be assembled together by any appropriate means: welding, adhesive bonding, mechanical clamping, etc. This structure may either be housed inside an existing casing, or constitute this casing via its outer layers, these outer layers and the lateral faces of the other layers being machined and/or covered with an appropriate material so as to constitute the casing, which may easily be profiled to ensure aerodynamic continuity with the surrounding surfaces (external surfaces of the aerofoils and the like, of the "pods", etc. in the case of an aircraft) and to ensure the necessary leaktightness, as the case may be.

Figure 6:
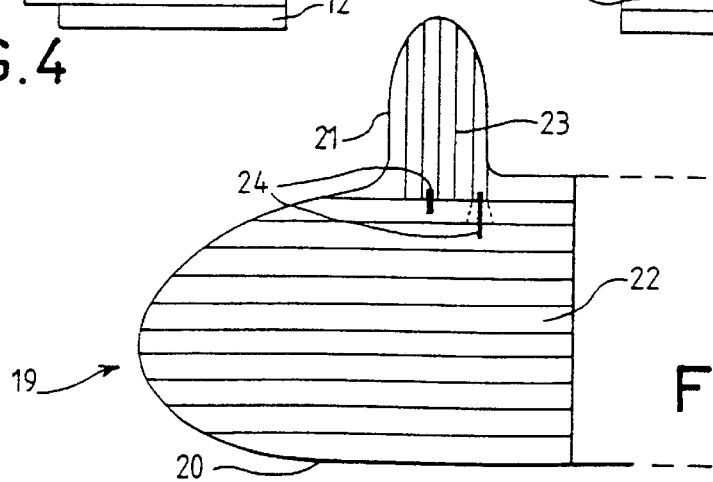
FIG. 6 is a simplified sectional view of a volume in which a structure according to the invention is placed, this view showing only the locations of two antennas directed in orthogonal directions, together with the plungers relating to these two antennas, these plungers forming part of one and the same layer of the multi-layer structure of the invention.

Represented in FIG. 6, in a very simplified manner, is an exemplary volume 19 with a more complex shape than the volume described above. This volume 19 comprises a first volume portion 20, similar to the portion 8 of FIG. 2, and another volume 21 forming an appendage on one of the substantially plane faces of the volume 20. This appendage 21 also has, in cross section, a "U" profile whose branches are, for example, perpendicular to that surface of the volume 20 on which this appendage is formed. The strata of the multi-layer structure 22 occupy only the volume 20 and are parallel to its plane surfaces, whilst the volume 21 is occupied by a multi-layer structure 23, the surfaces of whose layers are perpendicular to those of the layers of the structure 22. Diagrammatically represented at 24 are connections made directly, in an appropriate manner, between the circuits of the structure 22 and those of the structure 23.

The structure in accordance with the invention allows not only optimal use to be made of restricted volumes, and/or of complex shapes, but also makes it possible to incorporate therein the maximum possible number of elements by using integration techniques known per se, and thereby to reduce the length and/or the number of connection lines between the various elements, and therefore, as the case may be, to improve their performance by virtue of this maximum integration, this structure possibly even being a constituent element of the carrier.

What is claimed is:

1. A structure of electronic circuits having a physical form optimized to conform to a volume available within a housing having a frontal shape with a small radius of curvature and having at least one plane surface, the structure comprising:

a stack of plane layers including at least one electronic circuit and configured to be placed in the housing and to border the at least one plane surface;

wherein the plane layers are parallel to the plane surface; and wherein a front edge of the plane layers closely conforms to the frontal shape of the housing with the small radius of curvature.

2. The structure of claim 1, wherein:

the stack of plane layers includes at least one element from a group of elements including: electrical circuits, optical circuits, waveguides, discrete components, integrated components, insulation elements, thermal elements, stiffening elements, and protector elements; and the layers in the stack of plane layers are substantially parallel to a largest plane surface of the housing.

3. The structure of claim 2, wherein the elements are included or formed in several successive layers.

4. The structure of claim 1, wherein the plane layers have thicknesses of different respective values.

5. The structure of claim 1, wherein:

the structure is configured to be housed in a volume having several planar surfaces with mutually different orientations, and the structure comprises several different stacks of layers respectively parallel to the planar surfaces.

6. The structure of claim 1, wherein the structure is configured as part of an airborne radar.

7. The structure of claim 1, wherein the structure is configured as part of electronic warfare hardware.

8. The structure of claim 1, wherein the structure is configured as part of telecommunications hardware.

* * * * *